(12) United States Patent
Kuo et al.

(10) Patent No.: US 8,627,242 B1
(45) Date of Patent: Jan. 7, 2014

(54) METHOD FOR MAKING PHOTOMASK LAYOUT

(71) Applicant: United Microelectronics Corp., Hsinchu (TW)

(72) Inventors: Hui-Fang Kuo, Tainan (TW); Ming-Jui Chen, Hsinchu (TW); Cheng-Te Wang, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/754,257

(22) Filed: Jan. 30, 2013

(51) Int. Cl.
*G06F 17/50* (2006.01)
(52) U.S. Cl.
USPC ............................................... 716/53; 716/52
(58) Field of Classification Search
USPC ...................................................... 716/50–55
See application file for complete search history.

(56) References Cited

U.S. PATENT DOCUMENTS

| | | | |
|---|---|---|---|
| 5,245,470 A | 9/1993 | Keum | |
| 5,446,669 A | 8/1995 | Yamashita et al. | |
| 5,602,644 A | 2/1997 | Ota | |
| 5,689,339 A | 11/1997 | Ota et al. | |
| 5,716,763 A | 2/1998 | Benoit et al. | |
| 5,807,439 A | 9/1998 | Akatsu et al. | |
| 6,033,811 A | 3/2000 | Lee | |
| 6,275,744 B1 | 8/2001 | Yoshida | |
| 6,286,524 B1 | 9/2001 | Okuchi et al. | |
| 6,395,438 B1 | 5/2002 | Bruce et al. | |
| 6,470,489 B1 | 10/2002 | Chang et al. | |
| 6,509,971 B2 | 1/2003 | Inoue et al. | |
| 6,566,021 B2 | 5/2003 | Wang | |
| 6,684,382 B2 | 1/2004 | Liu | |
| 6,724,463 B2 | 4/2004 | Taniguchi | |
| 6,753,115 B2 | 6/2004 | Zhang et al. | |
| 6,763,514 B2 | 7/2004 | Zhang | |
| 6,781,670 B2 | 8/2004 | Krautschik | |
| 6,788,477 B2 | 9/2004 | Lin | |
| 6,795,169 B2 | 9/2004 | Tanaka et al. | |
| 6,815,664 B2 | 11/2004 | Wang et al. | |
| 6,852,453 B2 | 2/2005 | Wu | |
| 6,867,844 B2 | 3/2005 | Vogel et al. | |
| 6,891,596 B2 | 5/2005 | Rostalski et al. | |
| 6,961,920 B2 | 11/2005 | Zach | |
| 6,979,822 B1 | 12/2005 | Stewart et al. | |
| 7,090,963 B2 | 8/2006 | Medeiros et al. | |
| 7,150,945 B2 | 12/2006 | Mackey | |
| 7,247,887 B2 | 7/2007 | King et al. | |
| 7,386,829 B2 | 6/2008 | Lee | |
| 7,617,475 B2 | 11/2009 | Lin et al. | |
| 7,624,369 B2 | 11/2009 | Graur et al. | |
| 8,151,219 B2 | 4/2012 | Huckabay et al. | |
| 2004/0122636 A1* | 6/2004 | Adam | ................. 703/2 |
| 2005/0048223 A1 | 3/2005 | Pawloski et al. | |
| 2005/0175940 A1 | 8/2005 | Dierichs | |

(Continued)

*Primary Examiner* — Binh Tat
(74) *Attorney, Agent, or Firm* — J.C. Patents

(57) ABSTRACT

A method for making a photomask layout is provided. A first graphic data of a photomask is provided, wherein the first graphic data includes a first line with a first line end target, a second line with a second line end target and a hole, the first line is aligned with the second line, and the first line, the second line and the hole partially overlap with each other. Thereafter, a retarget step is performed to the first graphic data to obtain a second graphic data, wherein the retarget step includes moving the first line end target and the second line end target in opposite directions away from each other.

11 Claims, 5 Drawing Sheets

(56) References Cited

U.S. PATENT DOCUMENTS

| | | |
|---|---|---|
| 2005/0233081 A1 | 10/2005 | Tokita |
| 2005/0266354 A1 | 12/2005 | Li et al. |
| 2006/0023184 A1 | 2/2006 | Coon et al. |
| 2006/0066339 A1 | 3/2006 | Rajski et al. |
| 2006/0085772 A1 | 4/2006 | Zhang |
| 2006/0161452 A1 | 7/2006 | Hess |
| 2006/0188804 A1 | 8/2006 | Allen et al. |
| 2007/0020565 A1 | 1/2007 | Koh et al. |
| 2007/0072090 A1 | 3/2007 | Chang et al. |
| 2007/0158756 A1 | 7/2007 | Dreeskornfeld et al. |
| 2007/0215040 A1 | 9/2007 | Huang et al. |
| 2008/0067335 A1 | 3/2008 | Hou et al. |
| 2008/0248429 A1 | 10/2008 | Chou et al. |
| 2009/0191723 A1 | 7/2009 | Huang et al. |
| 2009/0193385 A1 | 7/2009 | Yang et al. |
| 2009/0233238 A1 | 9/2009 | Hsu et al. |
| 2009/0258500 A1 | 10/2009 | Yang et al. |
| 2009/0278569 A1 | 11/2009 | Taoka et al. |
| 2009/0300576 A1 | 12/2009 | Huang et al. |
| 2010/0036644 A1 | 2/2010 | Yang et al. |
| 2010/0070944 A1 | 3/2010 | Wu et al. |
| 2010/0086862 A1 | 4/2010 | Yang et al. |
| 2010/0131914 A1 | 5/2010 | Wu et al. |
| 2010/0162194 A1* | 6/2010 | Qian ............................... 716/11 |
| 2010/0175041 A1 | 7/2010 | Krasnoperova et al. |
| 2011/0014786 A1* | 1/2011 | Sezginer et al. .............. 438/618 |
| 2011/0029939 A1 | 2/2011 | Yang et al. |

\* cited by examiner

US 8,627,242 B1

METHOD FOR MAKING PHOTOMASK LAYOUT

BACKGROUND OF THE INVENTION

1. Field of Invention

The present invention relates to the design and manufacture of an integrated circuit (IC), and particularly to a method for making a photomask layout.

2. Description of Related Art

As the level of integration of integrated circuits is getting increased, the demand for increasing the feature density or reducing the pitch size becomes the mainstream in the semiconductor industry, and the key technology is in photolithography.

However, when the pitch size is beyond the photolithography resolution, a single exposure step is no longer applicable due to the pitch constraint. The pattern decomposition (or called "pattern split") technique is accordingly developed to meet the process requirements. After the target pattern is decomposed into two patterns respectively defined on two photomasks, the 2P2E (photo-etch-photo-etch) approach utilizing two exposure steps and two etching steps is implemented. However, the pattern decomposition may result in the alignment error between the exposure steps. Therefore, attention is drawn to how to improve the overlay window for the decomposed patterns.

SUMMARY OF THE INVENTION

Accordingly, the present invention provides a method for making a photomask layout, with which a greater overlay window is obtained for the decomposed patterns.

The present invention provides a method for making a photomask layout. A first graphic data of a photomask is provided, wherein the first graphic data includes a first line with a first line end target, a second line with a second line end target and a hole, the first line is aligned with the second line, and the first line, the second line and the hole partially overlap with each other. Thereafter, a retarget step is performed to the first graphic data to obtain a second graphic data, wherein the retarget step includes moving the first line end target and the second line end target in opposite directions away from each other.

According to an embodiment of the present invention, the step of providing the first graphic data includes providing a circuit design layout, the circuit design layout including a straight line and the hole; and decomposing the straight line into the first line and the second line due to a pitch constraint and a corner-to-corner constraint, the first line, the second line and the hole partially overlapping with each other.

According to an embodiment of the present invention, the step of decomposing the straight line is executed with a first electronic design automation (EDA) tool and the retarget step is executed with a second EDA tool.

According to an embodiment of the present invention, the method further includes performing an optical proximity correction (OPC) to the second graphic data after the retarget step.

According to an embodiment of the present invention, the step of performing the OPC is executed with a third EDA tool.

According to an embodiment of the present invention, the second EDA tool is the same as the third EDA tool.

According to an embodiment of the present invention, the second EDA tool is different from the third EDA tool.

According to an embodiment of the present invention, the straight line and the hole respectively define different features at different planes on a substrate.

According to an embodiment of the present invention, the first line is defined on a first photomask, the second line is defined on a second photomask, and the hole is defined on a third photomask.

According to an embodiment of the present invention, the first graphic data further includes a first pattern proximate to the second line and a second pattern proximate to the first line, the first pattern is further defined on the first photomask, and the second pattern is further defined on the second photomask.

According to an embodiment of the present invention, the retarget step includes moving the first line end target and the second line end target respectively to opposite edges of the hole.

According to an embodiment of the present invention, the method further includes performing an optical proximity correction (OPC) to the second graphic data after the retarget step.

In view of the above, in the method for making a photomask layout of the present invention, the retarget step increases the overlapping area for the decomposed patterns with a hole therebetween, so that a short caused by the insufficient overlay window can be avoided, and the performance of the device can be increased.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
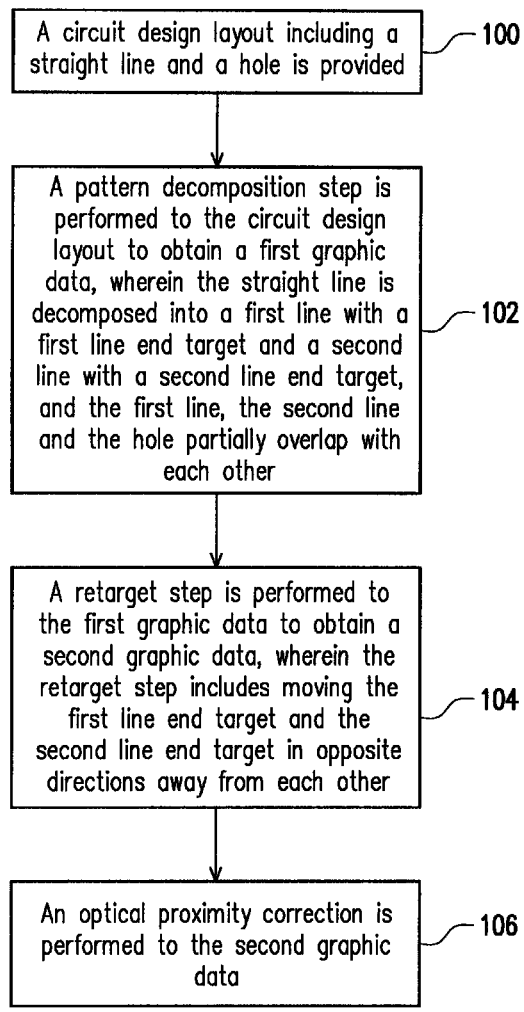
FIG. 1 illustrates a process flow of a method for making a photomask layout according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a process flow of a method for making a photomask layout according to an embodiment of the present invention.

Referring to FIG. 1, in the step 100, a circuit design layout including a straight line and a hole is provided. The circuit design layout can be made by an IC designer and stored in a GDS file. The straight line and the hole respectively define different features at different planes on a substrate. In an embodiment, the straight line can define a conductive line (e.g. wire) and the hole can define a conductive plug (e.g. contact or via) below or above the conductive line. Besides, the circuit design layout can further include a first pattern proximate to the second line and a second pattern proximate to the first line. The straight line, the first pattern and the second pattern define the same layer on the substrate.

In the step 102, a pattern decomposition step is performed to the circuit design layout to obtain a first graphic data. During the pattern decomposition step, the straight line is decomposed into a first line with a first line end target and a second line with a second line end target due to the pitch constraint, and the first line, the second line and the hole partially overlap with each other. Specifically, since the pitch size is beyond the photolithography resolution, the first line and the first pattern have to be defined on a first photomask, and the second line and the second pattern have to be defined on a second photomask, all of which define the same layer on the substrate. Besides, the hole for defining another layer on the substrate is defined on a third photomask. The pattern decomposition step can be executed by a first electronic design automation (EDA) tool, such as Calibre, Trademark of Mentor Graphics.

In the step 104, a retarget step is performed to the first graphic data to obtain a second graphic data, wherein the retarget step includes moving the first line end target and the second line end target in opposite directions away from each other. In an embodiment, during the retarget step, the first line end target and the second line end target are moved respectively to the opposite edges of the hole. The retarget step can be executed by a second EDA tool. The retarget step is beneficial to increase the overlay window for the decomposed patterns (e.g. first and second lines).

In the step 106, an optical proximity correction (OPC) is performed to the second graphic data. OPC is a photolithography enhancement technique commonly used to compensate for image errors due to diffraction or process effects. OPC corrects these errors by adding extra polygons to the pattern written on the photomask. The OPC can be a rule-based OPC, a model-based OPC or a hybrid of both. The OPC step is executed by a third EDA tool. In an embodiment, the retarget step 104 and the OPC step 106 are executed by the same EDA tool, such as Proteus, Trademark of Labcenter electronics. In another embodiment, the retarget step 104 and the OPC step 106 are executed by different EDA tools.

The invention is described in more detail with reference to the two embodiments in the following.

First Embodiment

Figure 2A:
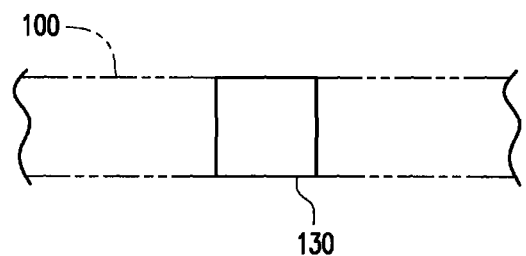
FIG. 2A to FIG. 2C illustrate a procedure of making a photomask layout according to a first embodiment of the present invention.
Figure 2B:
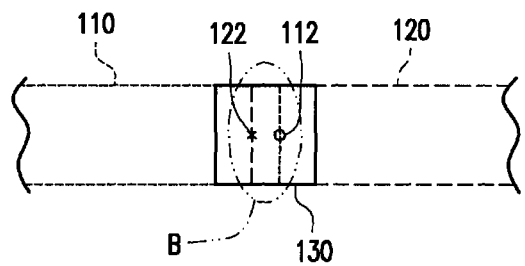
Figure 2C:
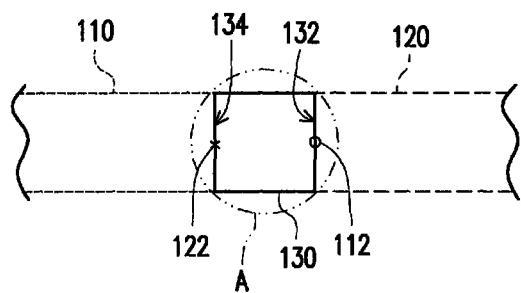

FIG. 2A to FIG. 2C illustrate a procedure of making a photomask layout according to a first embodiment of the present invention.

Referring to FIG. 2A, a circuit design layout including a straight line 100 and a hole 130 is provided. In this embodiment, the straight line 100 is for defining a conductive line (e.g. polysilicon line) on a substrate, and the hole 130 is for defining a conductive plug (e.g. contact) above the conductive line.

Referring to FIG. 2B, the straight line 100 is decomposed into a first line 110 with a first line end target 112 and a second line 120 with a second line end target 122 due to the pitch constraint and corner-to-corner constraint, and the first line 110, the second line 120 and the hole 130 partially overlap with each other. The pitch constraint and corner-to-corner constrain are defined by the IC design rule. The first graphic data is thus obtained upon the pattern decomposition step. Herein, the first line 110 is aligned with the second line 120.

Referring to FIG. 2C, a retarget step is performed to the first graphic data to obtain a second graphic data, wherein the retarget step includes moving the first line end target 112 and the second line end target 122 in opposite directions away from each other. In this embodiment, the first line end target 112 and the second line end target 122 are moved respectively to opposite edges 132 and 134 of the hole 130. Thereafter, an OPC (not shown) is performed to the second graphic data.

It is noted that the first and second lines 110 and 120 for defining a layer on a substrate have to be defined on different photomasks (e.g. first and second photomasks) due to the pitch constraint, and the hole 130 for defining another layer on the substrate is defined on a third photomask. Therefore, the overlapping area between the first line 110, the second line 120 and the hole 130 is critical to the performance of the device.

In the first embodiment, a greater overlay window is obtained due to the retarget step. Specifically, the retarget step removes the first line end target 112 and the second line end target 122 in opposite directions away from each other, so that the overlapping area A after the retarget step (as shown in FIG. 2C) is greater than the overlapping area B before the retarget step (as shown in FIG. 2B).

Second Embodiment

FIG. 3A to FIG. 3D illustrate a procedure of making a photomask layout according to a second embodiment of the present invention.

Figure 3A:
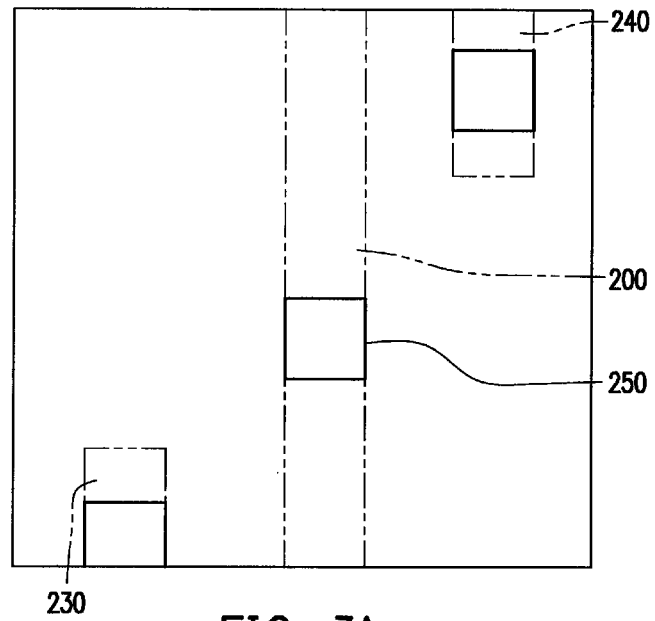
FIG. 3A to FIG. 3D illustrate a procedure of making a photomask layout according to a second embodiment of the present invention.

Referring to FIG. 3A, a circuit design layout including a straight line 200, a first pattern 230, a second pattern 240 and a hole 250 is provided. In this embodiment, the straight line 200, the first pattern 230 and the second pattern 240 are for defining the same layer (e.g. polysilicon layer) on a substrate, and the hole 250 is for defining another layer (e.g. contact) on the substrate.

Figure 3B:
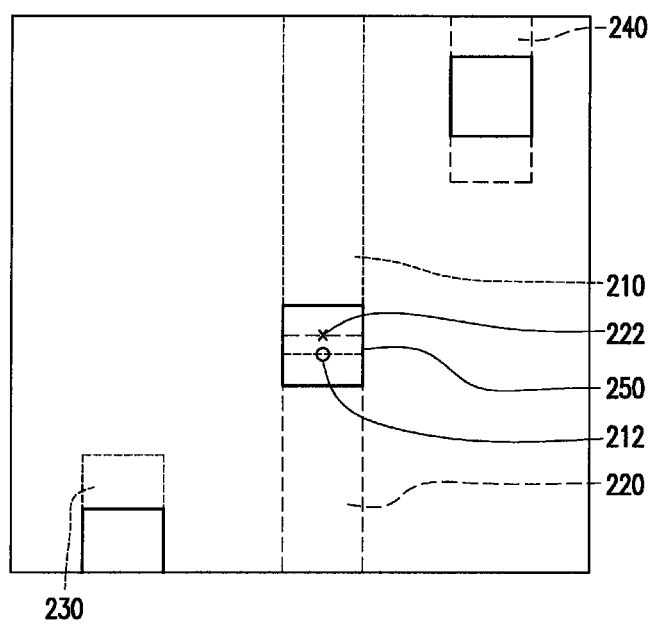

Referring to FIG. 3B, the straight line 200 is decomposed into a first line 210 with a first line end target 212 and a second line 220 with a second line end target 222 due to the pitch constraint and corner-to-corner constraint, and the first line 210, the second line 220 and the hole 250 partially overlap with each other. The pitch constraint and corner-to-corner constrain are defined by the IC design rule. The first pattern 230 is approximate to the second line 220, and the second pattern 240 is approximate to the first line 210. The first graphic data is thus obtained upon the pattern decomposition step. Herein, the first line 210 is aligned with the second line 220.

It is noted that the distance between the first pattern 230 and the second line 220 is beyond the photolithography resolution, so that the first pattern 230 and the second line 220 have to be defined on different photomasks. Similarly, the distance between the second pattern 240 and the first line 210 is beyond the photolithography resolution, so that the second pattern 240 and the first line 210 have to be defined on different photomasks. In this embodiment, the first line 210 and the first pattern 230 are defined on a first photomask, and the second line 220 and the second pattern 240 are defined on a second photomask.

Figure 3C:
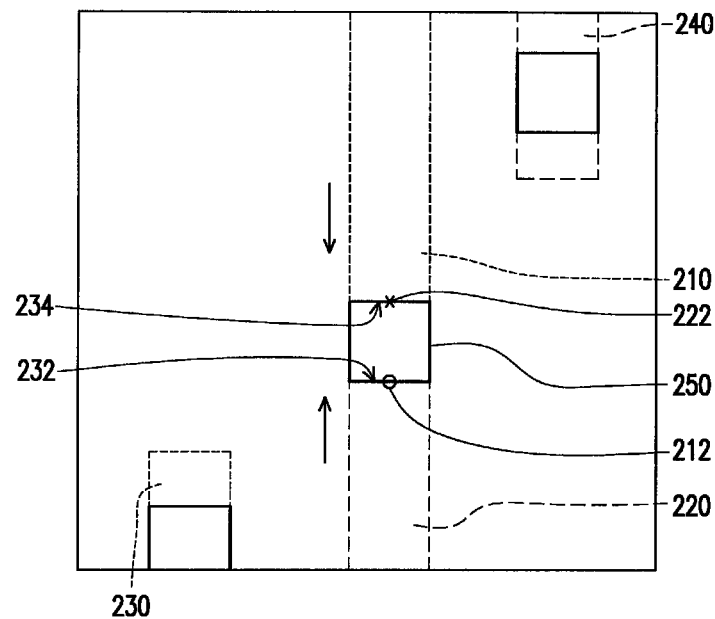

Referring to FIG. 3C, a retarget step is performed to the first graphic data to obtain a second graphic data, wherein the retarget step includes moving the first line end target 212 and the second line end target 222 in opposite directions away from each other. In this embodiment, the first line end target 212 and the second line end target 222 are moved respectively to opposite edges 232 and 234 of the hole 250. A greater overlay window between the first line 210, the second line 220 and the hole 250 is thus obtained.

Figure 3D:
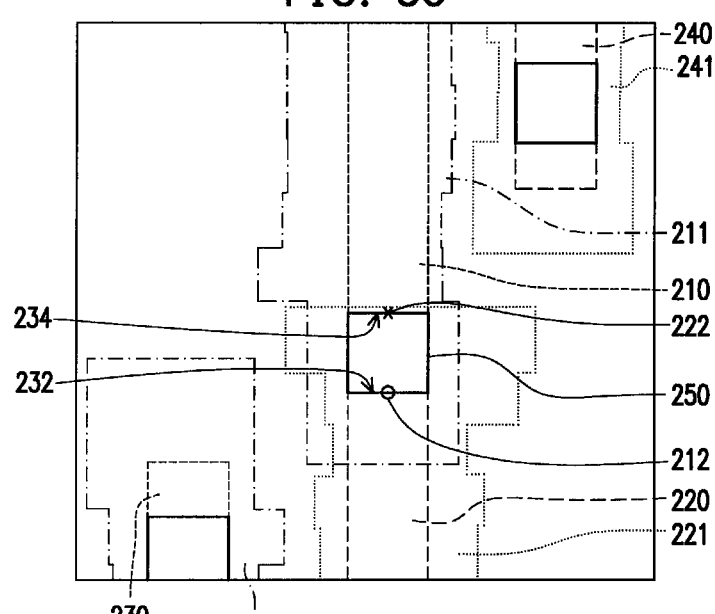

Referring to FIG. 3D, an OPC is performed to the second graphic data. The OPC adds extra polygons to all of the lines/patterns/holes included in the second graphic data. The OPC pattern 211 of first line 210, the OPC pattern 221 of the second line 220, the OPC pattern 231 of the first pattern 230 and the OPC pattern 241 of the second pattern 240 are shown in FIG. 3D. For clarity of illustration, the OPC pattern of the hole 250 is omitted from FIG. 3D. It is noted that the OPC pattern 211 of first line 210 and the OPC pattern 221 of the second line 220 are defined by the mask constraint and have their own limits. Specifically, the mask constraint is present between the first line 210 and the second pattern 240 and between the second line 220 and the first pattern 230, so that the OPC pattern 211 of first line 210 and the OPC pattern 221 of the second line 220 can merely be overlapped as much as possible, with the proviso that no pattern bridge occurs between the calculated projection contours of the first line 210 and second pattern 240 and between the calculated projection contours of the second line 220 and first pattern 230.

Figure 4:
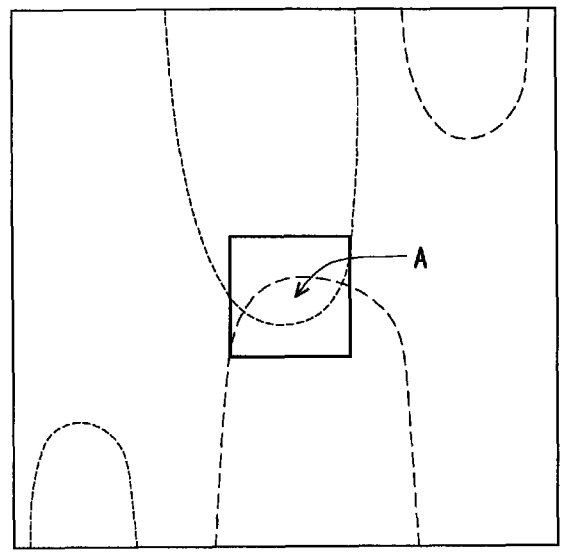
FIG. 4 illustrates the calculated projection contour of the photomask layout of FIG. 3D.
Figure 5:
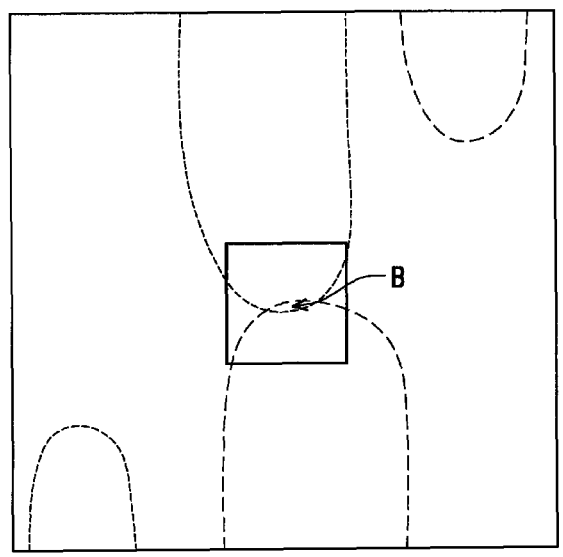
FIG. 5 illustrates the calculated projection contour of the conventional photomask layout, in which the photomask layout is made without performing a retarget step.

FIG. 4 illustrates the calculated projection contour of the photomask layout of FIG. 3D. FIG. 5 illustrates the calculated projection contour of the conventional photomask layout, in which the photomask layout is made without performing a retarget step.

From FIG. 4 and FIG. 5, it is obvious that the retarget step helps to increase the overlay window for the decomposed patterns (e.g. first and second lines) with a hole therebetween. Specifically, the retarget step removes the first line end target 212 and the second line end target 222 in opposite directions away from each other, so that the overlapping area A of the calculated projection contour of the photomask layout of the present invention (as shown in FIG. 4) is greater than the overlapping area B of the calculated projection contour of the conventional photomask layout (as shown in FIG. 5).

In summary, the present invention provides a method for making a photomask layout, with which a greater overlay window is obtained for the decomposed patterns. Specifically, the retarget step moves the decomposed patterns to overlap more with each other so as to increase the overlapping area for the decomposed patterns. Accordingly, a short caused by the insufficient overlay window can be avoided, and the performance of the device can be increased.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method for making a photomask layout, the method comprising:
   providing a first graphic data of a photomask, wherein the first graphic data comprises a first line with a first line end target, a second line with a second line end target and a hole, the first line is aligned with the second line, and the first line, the second line and the hole partially overlap with each other; and
   performing a retarget step to the first graphic data, by using a computer, to obtain a second graphic data, wherein the retarget step comprises moving the first line end target and the second line end target in opposite directions away from each other,
   wherein the step of providing the first graphic data comprises:
   providing a circuit design layout, the circuit design layout comprising a straight line and the hole; and
   decomposing the straight line into the first line and the second line due to a pitch constraint and a corner-to-corner constraint, the first line, the second line and the hole partially overlapping with each other.

2. The method of claim 1, wherein the step of decomposing the straight line is executed with a first electronic design automation (EDA) tool and the retarget step is executed with a second EDA tool.

3. The method of claim 2, further comprising performing an optical proximity correction (OPC) to the second graphic data after the retarget step.

4. The method of claim 3, wherein the step of performing the OPC is executed with a third EDA tool.

5. The method of claim 4, wherein the second EDA tool is the same as the third EDA tool.

6. The method of claim 4, wherein the second EDA tool is different from the third EDA tool.

7. The method of claim 1, wherein the straight line and the hole respectively define different features at different planes on a substrate.

8. The method of claim 1, wherein the first line is defined on a first photomask, the second line is defined on a second photomask, and the hole is defined on a third photomask.

9. The method of claim 8, wherein the first graphic data further comprises a first pattern proximate to the second line and a second pattern proximate to the first line, the first pattern is further defined on the first photomask, and the second pattern is further defined on the second photomask.

10. The method of claim 1, wherein the retarget step comprises moving the first line end target and the second line end target respectively to opposite edges of the hole.

11. The method of claim 1, further comprising performing an optical proximity correction (OPC) to the second graphic data after the retarget step.

* * * * *